(12) United States Patent
Yuan et al.

(10) Patent No.: US 12,148,768 B2
(45) Date of Patent: Nov. 19, 2024

(54) ARRAY SUBSTRATE AND DISPLAY PANEL

(71) Applicant: BOE Technology Group Co., Ltd., Beijing (CN)

(72) Inventors: Guangcai Yuan, Beijing (CN); Xue Dong, Beijing (CN); Feng Guan, Beijing (CN); Yupeng Gao, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/208,529

(22) Filed: Jun. 12, 2023

(65) Prior Publication Data

US 2023/0352496 A1 Nov. 2, 2023

Related U.S. Application Data

(63) Continuation of application No. 17/047,912, filed as application No. PCT/CN2020/081172 on Mar. 25, 2020, now Pat. No. 11,715,744.

(30) Foreign Application Priority Data

May 13, 2019 (CN) .......................... 201910392488.X

(51) Int. Cl.
*H01L 27/12* (2006.01)
(52) U.S. Cl.
CPC ........ *H01L 27/127* (2013.01); *H01L 27/1233* (2013.01)
(58) Field of Classification Search
CPC ............... H01L 27/127; H01L 27/1233; H01L 27/1218; H01L 27/1225; H01L 27/1237; H01L 27/1277; H01L 27/1281; H01L 27/1222; H01L 27/1274
See application file for complete search history.

(56) References Cited

U.S. PATENT DOCUMENTS

| 2013/0228750 A1 | 9/2013 | Chae et al. |
| 2014/0138695 A1 | 5/2014 | Tian et al. |
| 2014/0285224 A1 | 9/2014 | Albuschies |

(Continued)

FOREIGN PATENT DOCUMENTS

| CN | 102969250 A | 3/2013 |
| CN | 103247669 A | 8/2013 |

(Continued)

OTHER PUBLICATIONS

CN201910392488.X first office action.

(Continued)

*Primary Examiner* — Mohammed R Alam
(74) *Attorney, Agent, or Firm* — IPro, PLLC

(57) ABSTRACT

Disclosed are an array substrate and a display panel. The array substrate includes: a base substrate; a first thin film transistor on the base substrate; where the first thin film transistor includes: a first gate electrode, a first active layer, a first source electrode, and a first drain electrode; where the first active layer includes: at least one guide structure extending in a first direction; a silicon-based nanowire, disposed on a side of the guide structure facing away from the base substrate; and an extending direction of the silicon-based nanowire is same as an extending direction of the guide structure.

12 Claims, 16 Drawing Sheets

(56) References Cited

U.S. PATENT DOCUMENTS

| | | | |
|---|---|---|---|
| 2016/0336461 A1 | 11/2016 | Wang | |
| 2018/0122835 A1* | 5/2018 | Watakabe | ......... H01L 21/47573 |
| 2018/0286307 A1* | 10/2018 | Kim | ..................... G09G 3/3283 |
| 2020/0150502 A1 | 5/2020 | Xu | |
| 2020/0185539 A1* | 6/2020 | Lee | ................... H01L 29/42376 |

FOREIGN PATENT DOCUMENTS

| | | |
|---|---|---|
| CN | 103958397 A | 7/2014 |
| CN | 104576744 A | 4/2015 |
| CN | 104882487 A | 9/2015 |
| CN | 105239156 A | 1/2016 |
| CN | 107086180 A | 8/2017 |
| CN | 107768386 A | 3/2018 |

OTHER PUBLICATIONS

PCT/CN2020/081172 international search report.
U.S. Appl. No. 17/047,912 Notice of Allowance dated Mar. 16, 2023.

\* cited by examiner

ARRAY SUBSTRATE AND DISPLAY PANEL

CROSS REFERENCE TO RELATED APPLICATIONS

This disclosure is a continuation application of U.S. application Ser. No. 17/047,912, filed Mar. 25, 2020, which claims priority to Chinese Patent Application No. 201910392488.X filed with the China National Intellectual Property Administration on May 13, 2019 and entitled "Array Substrate, Preparation Method Thereof, and Display Panel", the entire contents of which are incorporated herein by reference.

FIELD

The present disclosure relates to the field of semiconductor technology, in particular to an array substrate and a display panel.

BACKGROUND

Silicon-based nanowires are a new type of silicon-based semiconductor material developed in recent years, and have a one-dimensional size structure and more excellent semiconductor characteristics. The use of silicon-based nanowire as thin film transistor channels can achieve higher mobility and more stable characteristics.

When the silicon-based nanowires are used as a material of the thin film transistor channels, the size uniformity and controllability are particularly important. Therefore, to meet the uniformity requirement of display devices, how to obtain a thin film transistor having a silicon-based nanowire with a uniform and controllable size has become a hot research topic.

SUMMARY

In one aspect, embodiments of the present disclosure provide an array substrate, including: a base substrate;
a first thin film transistor on the base substrate;
where the first thin film transistor includes: a first gate electrode, a first active layer, a first source electrode, and a first drain electrode;
where the first active layer includes:
at least one guide structure extending in a first direction;
a silicon-based nanowire, disposed on a side of the guide structure facing away from the base substrate; and
an extending direction of the silicon-based nanowire is same as an extending direction of the guide structure.
In some embodiments, the first active layer includes a plurality of guide structures;
each of the plurality of guide structures extends in a first direction;
a cross section of the plurality of guide structures perpendicular to the first direction include a concave-convex structure;
where the concave-convex structure includes a concave portion and a convex portion; and the silicon-based nanowire is located at a position corresponding to the concave portion.
In some embodiments, surfaces of all convex portions of the concave-convex structure are approximately flush.
In some embodiments, a height difference between the convex portion and the concave portion is greater than or equal to 10 μm.

In some embodiments, the first active layer includes a plurality of guide structures;
each of the plurality of guide structures extends in a first direction;
a cross section of the plurality of guide structures perpendicular to the first direction include a stepped structure including at least one step; and
the silicon-based nanowire is located at a position corresponding to the step.
In some embodiments, a height of the step is greater than or equal to 10 μm.
In some embodiments, the plurality of guide structures are an integrated structure.
In some embodiments, the array substrate further includes: a first gate insulating layer, disposed on a side of the first gate electrode facing away from the base substrate;
where the first gate insulating layer is reused as the guide structure.
In some embodiments, the first gate electrode is disposed on a side of the first active layer facing away from the base substrate;
the array substrate further includes: a dielectric layer, disposed on a side of the first gate electrode facing the base substrate; and
the dielectric layer is reused as the guide structure.
In some embodiments, a material of the dielectric layer includes at least one of: aluminum oxide; silicon oxide; or silicon nitride.
In some embodiments, a length of the guide structure along the first direction is greater than a length of the silicon-based nanowire along the first direction.
In some embodiments, a connecting line direction of the first source electrode and the first drain electrode is same as the extending direction of the silicon-based nanowire.
In some embodiments, the array substrate further includes: a second thin film transistor on the base substrate;
where the second thin film transistor includes: a second gate electrode, a second active layer, a second source electrode, and a second drain electrode; and
a material of the second active layer is different from a material of the first active layer.
In some embodiments, the material of the second active layer includes at least one of: a low-temperature polysilicon material, a carbon nanotube material, or an oxide semiconductor material.
In some embodiments, the second thin film transistor further includes a second gate insulating layer; the first gate insulating layer is arranged on a same layer as the second gate insulating layer; and
the first source electrode, the first drain electrode, the second source electrode, and the second drain electrode are arranged on a same layer.
In second aspect, embodiments of the present disclosure further provide a display panel, which includes the above-mentioned array substrate provided by embodiments of the present disclosure.

DETAILED DESCRIPTION OF THE EMBODIMENTS

Figure 1:
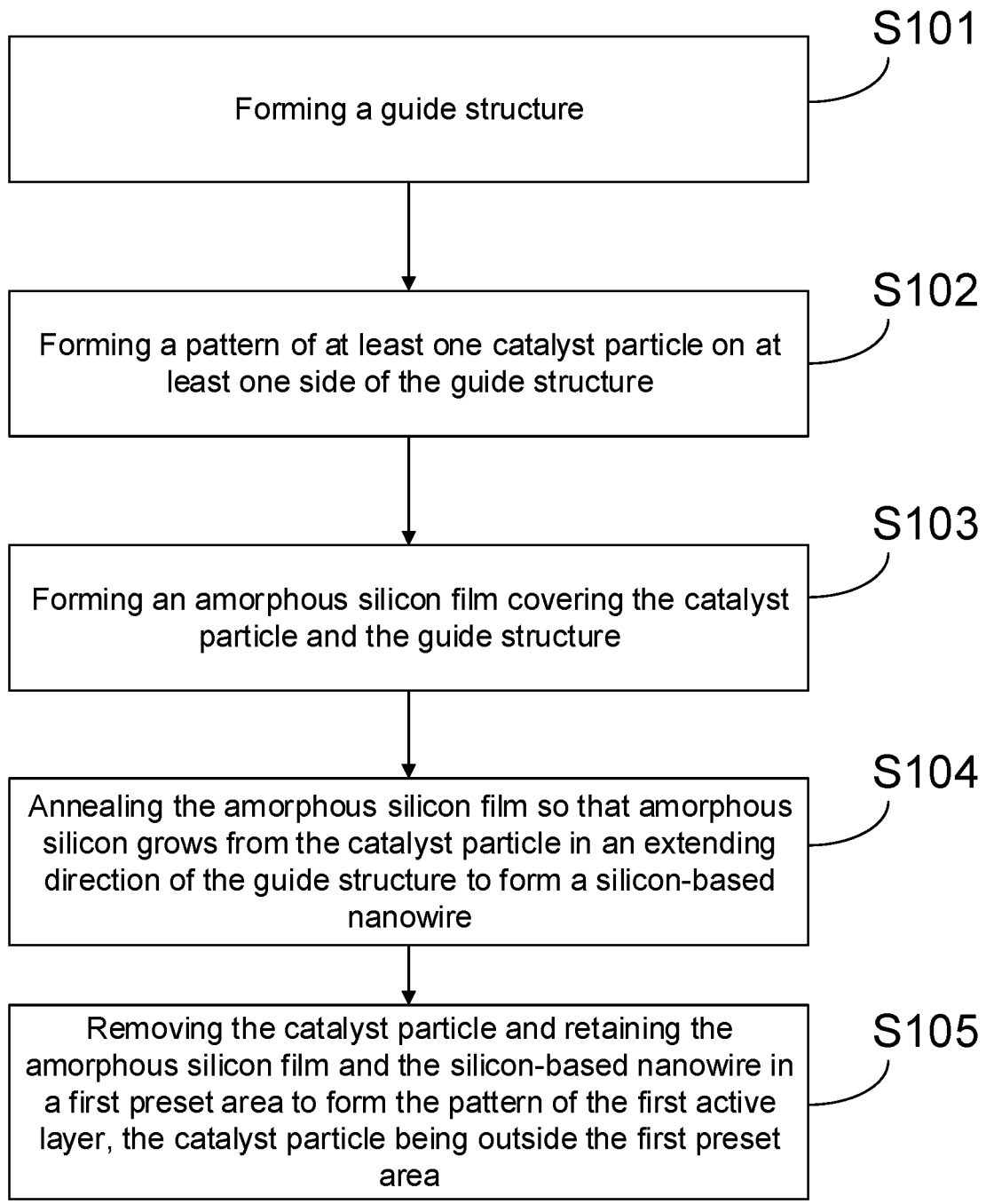
FIG. 1 is a flow diagram of some steps in a preparation method provided by an embodiment of the present disclosure.

To make the objects, technical solutions and advantages of the present disclosure clearer, the present disclosure will be further described in detail below in conjunction with the accompanying drawings. Apparently, the embodiments described are part of, rather than all of, the embodiments of the present disclosure. Based on the embodiments of the present disclosure, all other embodiments obtained by those of ordinary skill in the art without creative work shall fall within the protection scope of the present disclosure.

The shapes and sizes of the components in the drawings do not reflect the true scale, and are merely intended to illustrate the present disclosure.

A method for preparing an array substrate provided by embodiments of the present disclosure includes forming a first thin film transistor and a second thin film transistor on a base substrate.

The step of forming the first thin film transistor includes forming a pattern of a first gate electrode, a pattern of a first active layer, a pattern of a first source electrode, and a pattern of a first drain electrode on the base substrate.

The step of forming the second thin film transistor includes forming a pattern of a second gate electrode, a pattern of a second active layer, a pattern of a second source electrode, and a pattern of a second drain electrode on the base substrate.

The material of the first active layer is different from that of the second active layer.

The step of forming the pattern of the first active layer, as shown in FIG. 1, includes:

S101. forming a guide structure;

S102. forming a pattern of at least one catalyst particle on at least one side of the guide structure, the catalyst particle and silicon having a eutectic point;

S103. forming an amorphous silicon film covering the catalyst particle and the guide structure;

S104. annealing the amorphous silicon film so that amorphous silicon grows from the catalyst particle in an extending direction of the guide structure to form a silicon-based nanowire; and S105. removing the catalyst particle and retaining the amorphous silicon film and the silicon-based nanowire in a first preset area to form the pattern of the first active layer, wherein the catalyst particle is outside the first preset area.

The method for preparing an array substrate provided by embodiments of the present disclosure includes forming a first thin film transistor and a second thin film transistor on a base substrate. In the formation of an active layer of the first thin film transistor, by using an eutectic point of the catalyst particle and silicon, and a driving factor that the Gibbs free energy of amorphous silicon is greater than that of crystalline silicon (silicon-based nanowire), and due to absorption of the amorphous silicon by the molten catalyst particle to form a supersaturated silicon eutectoid, the silicon nucleates and grows into a silicon-based nanowire. Moreover, during the growth of the silicon-based nanowire, the amorphous silicon film grows linearly along the guide structure under the action of the catalyst particle, thus obtaining a silicon-based nanowire with a high density and high uniformity. In addition, by controlling the size of the catalyst particle and the thickness of the amorphous silicon film, the width of the silicon-based nanowire may also be controlled. In this way, a thin film transistor having a silicon-based nanowire with a uniform and controllable size is prepared.

In addition, the first active layer and the second active layer are made by different materials, such that different thin film transistors have different advantages to increase the application range of the array substrate.

In specific implementation, as the silicon-based nanowire has more excellent semiconductor characteristics and smaller size dimensions than polycrystalline silicon, the size of the first thin film transistor may be made relatively smaller, and thus applying the first thin film transistor in a border area of a panel can achieve a smaller border size; applying the first thin film transistor in a switching transistor can achieve a faster switching speed and a higher refresh frequency; and in the case where the first thin film transistor is used for a large-size transistor in a back plate, it can prevent a semiconductor layer from generating heat to cause device characteristic drift.

Optionally, in the preparation method provided by some embodiments of the present disclosure, the material of the second active layer is any one or more of a low-temperature polysilicon material, a carbon nanotube material or an oxide semiconductor material.

In specific implementation, low-temperature polysilicon has high mobility and stability, the uniformity is more difficult to control in a large-size panel adopting low-temperature polysilicon. A carbon nanotube also has high mobility and can achieve flexible display. An oxide semiconductor material is relatively low in mobility, but can ensure good uniformity in a large-size panel, and is low in leakage current, transparent, and simple in manufacturing process. Therefore, the material of the second active layer can be selected according to actual requirements. The second active layer is used in conjunction with the first active layer to meet different circuit requirements, such as adjusting a sub-threshold swing SS of the thin film transistor, an off-state current Ioff of the thin film transistor, and the mobility of the thin film transistor.

In specific implementation, to simplify the manufacturing process and save the production cost, in the first thin film transistor and the second thin film transistor, film layers with a same function are prepared in a same layer as much as possible.

Optionally, in the preparation method provided by some embodiments of the present disclosure, the pattern of the first gate electrode and the pattern of the second gate electrode are formed by one patterning process.

The pattern of the first source electrode, the pattern of the first drain electrode, the pattern of the second source electrode, and the pattern of the second drain electrode are simultaneously formed by one patterning process.

In specific implementation, in the above-mentioned preparation method provided by some embodiments of the present disclosure, in the case where the material of the second active layer is a low-temperature polysilicon material, to simplify process steps and save the production cost, the first active layer and the second active layer may be prepared by using a same layer of amorphous silicon film.

Specifically, in the preparation method provided by some embodiments of the present disclosure, the material of the second active layer is a low-temperature polysilicon material.

The pattern of the first active layer and the pattern of the second active layer are formed simultaneously by one patterning process, by:
    after annealing the amorphous silicon film, performing an excimer laser annealing treatment on the amorphous silicon film formed with the silicon-based nanowire, so that the amorphous silicon film is converted into a low-temperature polysilicon film;
    removing the catalyst particle, patterning the low-temperature polysilicon film, retaining the silicon-based nanowire and the low-temperature polysilicon film in a first preset area to form the pattern of the first active layer, and retaining the low-temperature polysilicon film in a second preset area to form the pattern of the second active layer.

It should be noted that in the preparation method provided by some embodiments of the present disclosure, the first preset area is an area for forming the first active layer, and the second present area is an area for forming the second active layer.

Specifically, in the preparation method provided by some embodiments of the present disclosure, the more guide structures, the more silicon-based nanowires are formed, and thus forming a plurality of guide structures can ensure there are a plurality of silicon-based nanowires in the first active layer, thereby improving the mobility of the first thin film transistor.

Figure 2A:
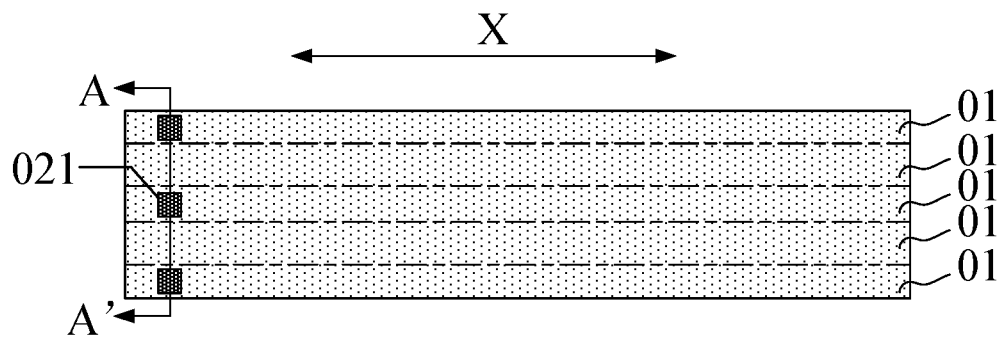
FIG. 2A is a structural diagram of a plurality of guide structures provided by an embodiment of the present disclosure.
Figure 3A:
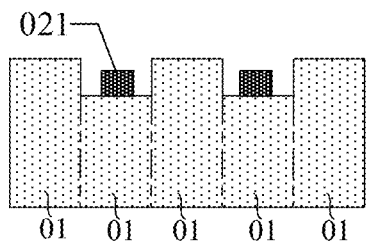
FIG. 3A is a cross-sectional diagram of the plurality of guide structures shown in FIG. 2A along a direction AA'.

Optionally, in the preparation method provided by some embodiments of the present disclosure, a plurality of guide structures 01 are formed, and any one of the plurality of guide structures 01 extends in a first direction X, as shown in FIG. 2A; and the materials of the plurality of guide structures may be the same. FIG. 3A is a cross-sectional diagram of the plurality of guide structures shown in FIG. 2A, along a direction AA'. As shown in FIG. 3A, a cross section of the plurality of guide structures 01 perpendicular to the first direction includes at least one concave-convex structure. In the concave-convex structure, surfaces of all convex portions are almost equal-height, and surfaces of all concave portions are almost equal-height; and one catalyst particle 021 is formed in each concave portion of the concave-convex construction, and a cross-sectional dimension of the catalyst particle 021 perpendicular to the first direction X is not greater than a cross-sectional dimension of the concave portion where catalyst particle is located.

It should be noted that a guide structure with an integrated structure may also be formed directly, and a top surface extending in the first direction of the guide structure includes the concave-convex structure shown in FIG. 3A.

Figure 2B:
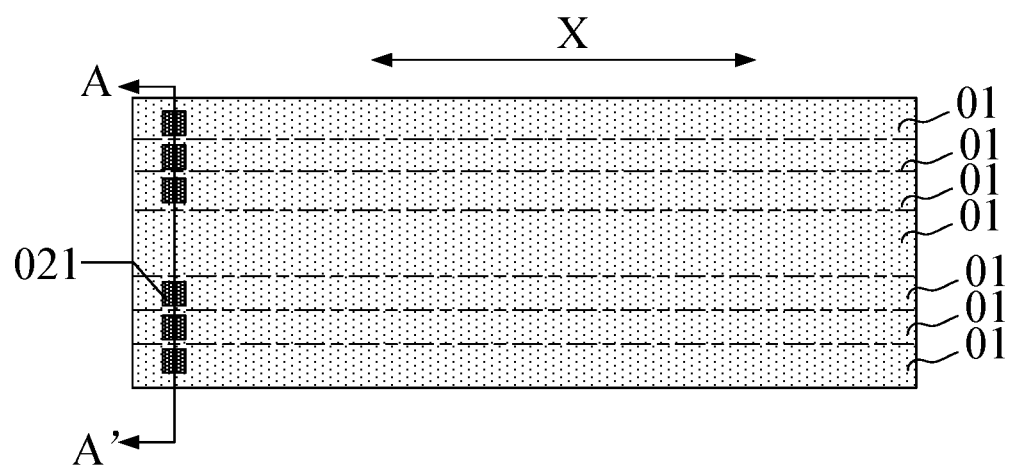
FIG. 2B is a structural diagram of a plurality of guide structures provided by an embodiment of the present disclosure.
Figure 3B:
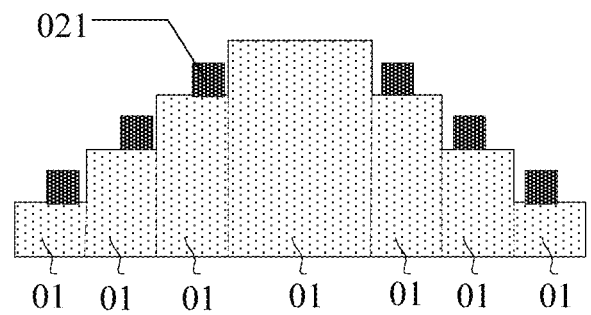
FIG. 3B is another cross-sectional diagram of the plurality of guide structures shown in FIG. 2B along a direction AA'.

Optionally, in the preparation method provided by some embodiments of the present disclosure, a plurality of guide structures 01 are formed, and any one of the plurality of guide structures 01 extends in a first direction X, as shown in FIG. 2B; and the materials of the plurality of guide structures may be the same. FIG. 3B is a cross-sectional diagram of the plurality of guide structures shown in FIG. 2B, along a direction AA'. As shown in FIG. 3B, a cross section of the guide structures 01 perpendicular to the first direction include is a stepped structure including at least one step; and one catalyst particle 021 is formed on each step of the stepped structure, and a cross-sectional dimension of the catalyst particle 021 perpendicular to the first direction X is not greater than a cross-sectional dimension of the step where catalyst particle is located. It may be understood that a guide structure with an integrated structure may also be formed directly, and a top surface extending in the first direction of the guide structure includes the stepped structure with at least one step shown in FIG. 3B.

In specific implementation, as shown in FIGS. 3A and 3B, the cross section of the guide structures 01 perpendicular to the first direction include a concave-convex structure or a stepped structure with at least one step, so that multi-level distribution of silicon-based nanowires can be achieved, thereby solving the heat dissipation problem while increasing a channel width.

Of course, in specific implementation, the cross section of the plurality of guide structures perpendicular to the first direction may include both a concave-convex structure and a stepped structure, which is not limited here.

It may be understood that the plurality of guide structures may be fabricated at separate times, such as forming a plurality of strip-like structures respectively; if the materials of the plurality of guide structures are the same, they may also finally form an integrated structure; the plurality of guide structures may also be patterned after one film forming process, thus being formed into one piece.

It should be noted that in the preparation method provided by some embodiments of the present disclosure, a side surface, extending in the first direction, of each guide structure may also be a flat surface. In specific implementation, an included angle between the side surface and a bottom surface is preferably greater than or equal to 60°, which can ensure that the subsequent amorphous silicon film can cover the catalyst particle at the side surface of the guide structure, to ensure normal growth of the silicon-based nanowire.

Optionally, in the preparation method provided by some embodiments of the present disclosure, the pattern of the first active layer is formed after the pattern of the first gate electrode is formed.

The formation of the plurality of guide structures includes:
    forming a first gate insulating layer after the pattern of the first gate electrode is formed and before the pattern of the first active layer is formed; and
    patterning the first gate insulating layer to form the guide structures.

In specific implementation, patterning the first gate insulating layer to form the guide structure(s) can avoid the increase in the thickness of the array substrate caused by separately adding a film layer for preparing the guide structure(s).

Optionally, in the preparation method provided by some embodiments of the present disclosure, the pattern of the first active layer is formed after the pattern of the first gate electrode is formed.

The formation of the plurality of guide structures specifically includes:

forming the pattern of the first gate electrode including a concave-convex structure in a cross section perpendicular to the first direction, or forming the pattern of the first gate electrode including a stepped structure with at least one step in a cross section perpendicular to the first direction; and forming a first gate insulating layer after the pattern of the first gate electrode is formed and before the pattern of the first active layer is formed, the pattern of the first gate electrode and the first gate insulating layer covering the first gate electrode form the guide structures.

In specific implementation, a surface of the first gate electrode is patterned to form the plurality of guide structures, and the first gate insulating layer covering the first gate electrode has corresponding structures as the first gate electrode has the contour of the guide structures. Forming the guide structures by using the pattern of the first gate electrode can avoid the increase in the thickness of the array substrate caused by separately adding a film layer for preparing the guide structures, and this does not need to add a patterning process, and is achieved just by changing the pattern of the existing gate electrode.

In specific implementation, in the preparation method provided by some embodiments of the present disclosure, the first gate insulating layer may be also used as a gate insulating layer of the second thin film.

Optionally, in the preparation method provided by some embodiments of the present disclosure, the pattern of the first active layer is formed before the pattern of the first gate electrode is formed.

The formation of the plurality of guide structures specifically includes: forming a dielectric layer on the base substrate, and patterning the dielectric layer to form the plurality of guide structures.

In specific implementation, in the preparation method provided by some embodiments of the present disclosure, the dielectric layer may be formed by a deposition method, which is not limited here.

In specific implementation, the material of the dielectric layer may be aluminum oxide (AlOx), silicon oxide (SiOx), or silicon nitride (SiNx), which is not limited here.

Further, in specific implementation, the dielectric layer may be a buffer layer of the array substrate. Of course, a buffer layer may also be formed on the base substrate before the formation of the dielectric layer, which is not limited here.

Optionally, in the preparation method provided by some embodiments of the present disclosure, the material of the catalyst particle includes indium, tin, nickel, or indium oxide, which is not limited here.

Optionally, in the preparation method provided by some embodiments of the present disclosure, the particle diameter of the catalyst particle may be controlled to 5 nm~10 μm, such as 5 nm, 10 nm, 50 nm, 100 nm, 500 nm, 1 μm, or 10 μm, which is not limited here.

Figure 4A:
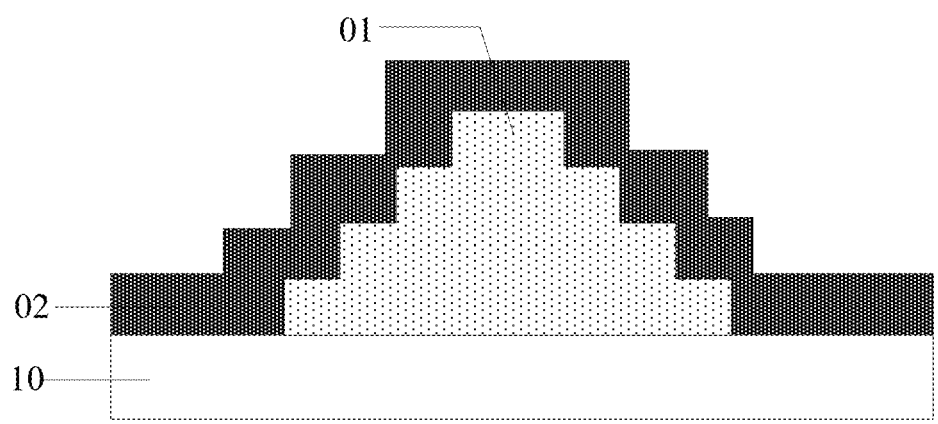
FIGS. 4A to 4D are structural diagrams in preparation of a catalyst particle provided by an embodiment of the present disclosure after respective steps are executed.
Figure 4B:
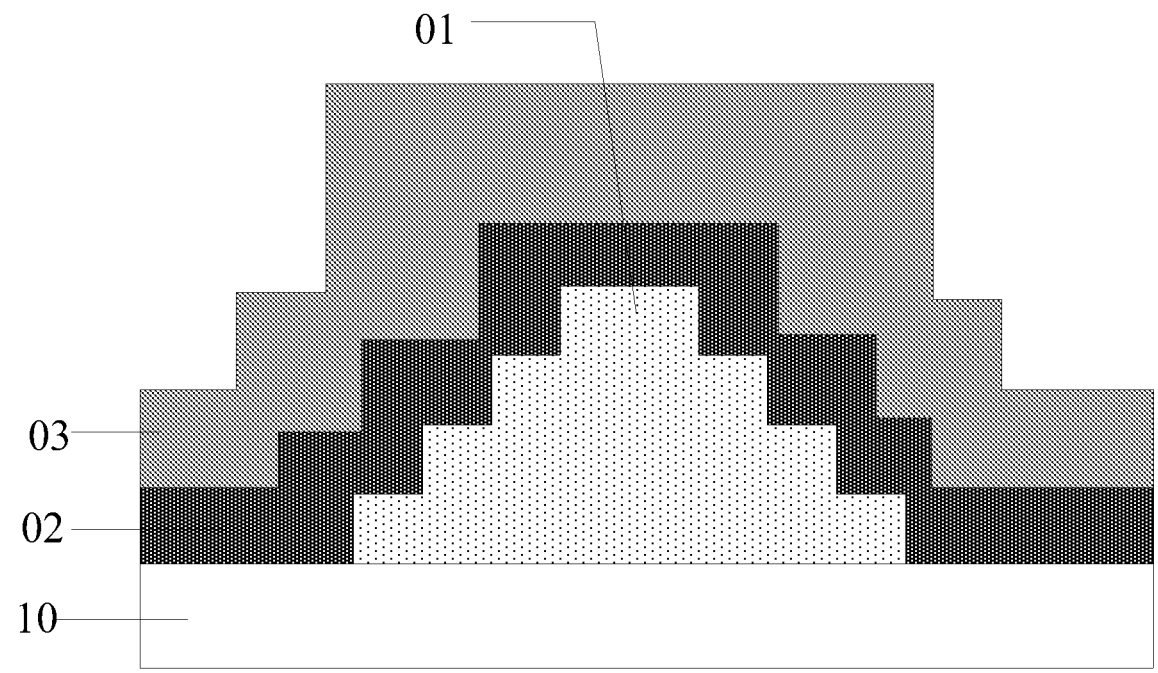
Figure 4C:
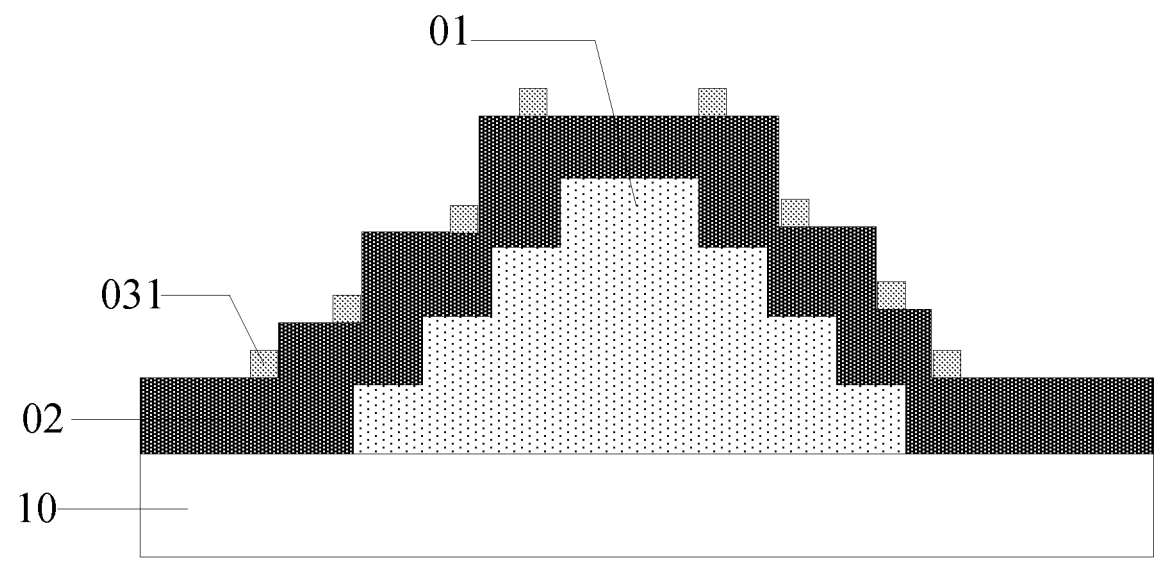
Figure 4D:
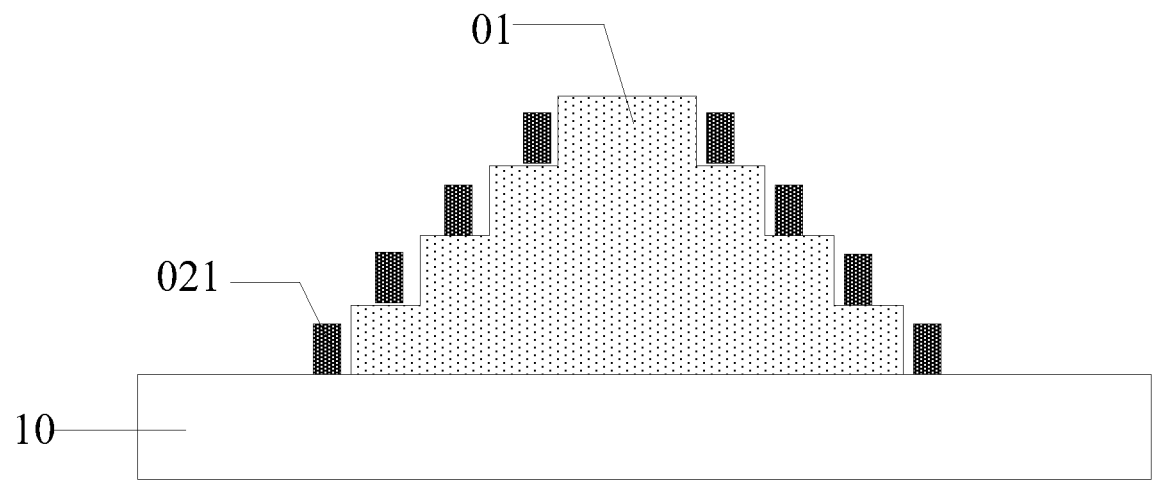

Optionally, in the preparation method provided by some embodiments of the present disclosure, forming the pattern of the catalyst particle(s) includes:

forming a catalyst film layer 02 on the base substrate 10 formed with the guide structure(s) 01, as shown in FIG. 4A;

forming an imprint resist 03 on the catalyst film layer 02, as shown in FIG. 4B;

nano-imprinting the imprint resist 03 to form a pattern of imprint resist particle(s) 031, as shown in FIG. 4C; and etching the catalyst film layer 02 by using the pattern of the imprint resist particle(s) 031 as a mask pattern, to form the pattern of the catalyst particle(s) 021, as shown in FIG. 4D.

Figure 5A:
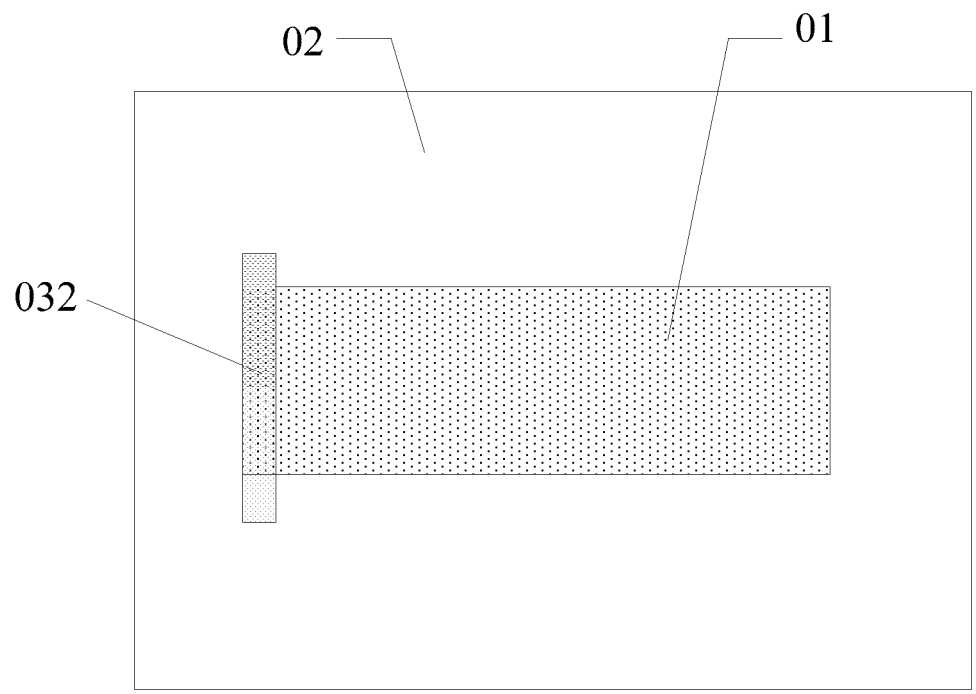
FIGS. 5A to 5C are structural diagrams in preparation of a catalyst particle provided by an embodiment of the present disclosure after respective steps are executed.
Figure 5B:
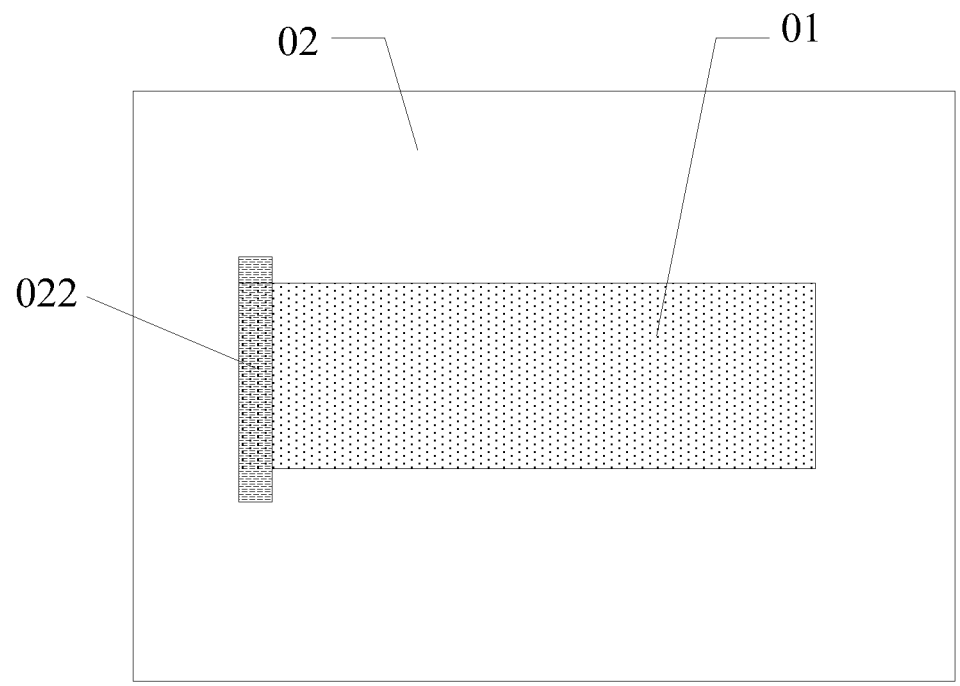
Figure 5C:
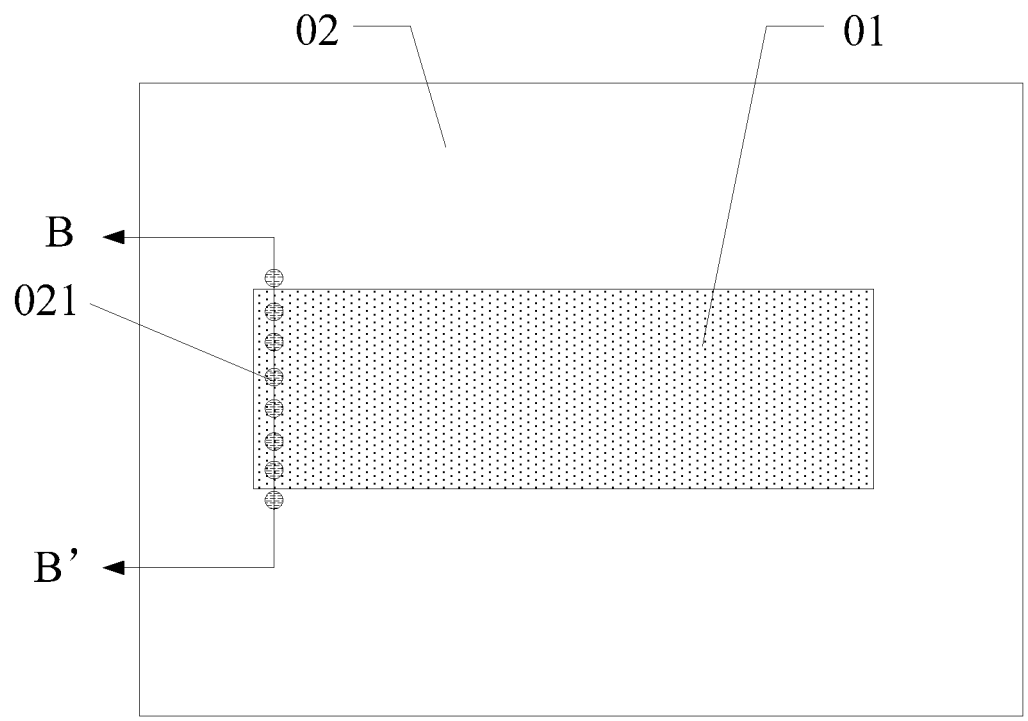

Or optionally, in the preparation method provided by some embodiments of the present disclosure, forming the pattern of the catalyst particle(s) specifically includes:

forming the catalyst film layer 02 on the base substrate 10 formed with the guide structure 01, as shown in FIG. 4A;

forming an imprint resist 03 on the catalyst film layer 02, as shown in FIG. 4B;

nano-imprinting the imprint resist 03 to form a pattern of an imprint resist line 032, wherein an extending direction of the imprint resist line 032 is perpendicular to the extending direction of the guide structure 01, as shown in FIG. 5A;

etching the catalyst film layer 02 by using the pattern of the imprint resist line 032 as a mask pattern, to form a pattern of a catalyst line 022, as shown in FIG. 5B; and performing plasma bombardment on the catalyst line to form the pattern of the catalyst particle(s) 021, as shown in FIGS. 5C and 4D. FIG. 4d is a cross-sectional diagram of FIG. 5c along a direction B-B'.

In specific implementation, using the nanoimprint process to form the pattern of the catalyst particle(s) can achieve high refineness of the pattern and ensure the uniformity and controllability of the catalyst particle, to ensure uniform growth of the silicon-based nanowire(s).

Optionally, in the preparation method provided by some embodiments of the present disclosure, the width of the catalyst line is controlled to 50 nm~1000 nm, such as 50 nm, 100 nm, 500 nm, or 1000 nm, which is not limited here.

In specific implementation, the particle diameter of the catalyst particle is determined according to the width of the silicon-based nanowire. Generally, the particle diameter of the catalyst particle is approximately close to the width of the silicon-based nanowire.

Of course, in specific implementation, the pattern of the catalyst particle may also be formed by a lithography process. Therefore, optionally, in the preparation method provided by some embodiments of the present disclosure, forming the pattern of the catalyst particle(s) includes:

forming a catalyst film layer on the base substrate formed with the guide structure;

forming a photoresist on the catalyst film layer;

performing an exposure and developing process on the photoresist to form a pattern of photoresist particle(s); and etching the catalyst film layer by using the pattern of the photoresist particle(s) as a mask pattern, to form the pattern of the catalyst particle(s).

In specific implementation, in the preparation method provided by some embodiments of the present disclosure, the catalyst particle is formed at one end in the extending direction of the guide structure, which can ensure that the silicon-based nanowire extends and grows from one end to the other end of the guide structure.

Further, in the preparation method provided by some embodiments of the present disclosure, the guide structure may be rectilinear or curvilinear along the extending direction, which is not limited here.

In specific implementation, in the preparation method provided by some embodiments of the present disclosure, the structure of the first thin film transistor formed may be a bottom-gate structure, or may also be a top-gate structure; similarly, the structure of the second thin film transistor formed may be a bottom-gate structure, or may also be a top-gate structure, which is not limited here. To simplify the process and reduce the cost, the structures of the first thin film transistor and the second thin film transistor formed are both bottom-gate structures, or both top-gate structures. Film layers made of a same material and having a same function may be formed by one patterning process.

The preparation method provided by embodiments of the present disclosure is described below with specific embodiments.

Using the first thin film transistor and the second thin film transistor being both bottom-gate structures as an example, some embodiments provided by the present disclosure include the following steps.

Figure 6A:
FIGS. 6A to 6H are structural diagrams in preparation of an array substrate provided by an embodiment of the present disclosure after respective steps are executed.

Step 1: as shown in FIG. 6A, patterns of a first gate electrode 11 and a second gate electrode 21 are formed on a base substrate 10 by one patterning process.

In specific implementation, the material of the gate electrodes may be a metal or alloy such as molybdenum (Mo), aluminum (Al), copper (Cu), or nickel (Ti), and its thickness may be controlled to 50 nm~5000 nm, which is not limited here.

Figure 6B:
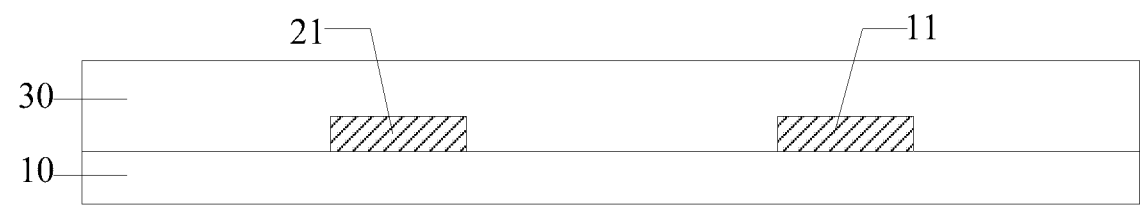

Step 2: as shown in FIG. 6B, a gate insulating layer 30 is formed.

In specific implementation, the material of the gate insulating layer is a dielectric material, and its thickness may be controlled to 50 nm~5000 nm, which is not limited here.

Figure 6C:
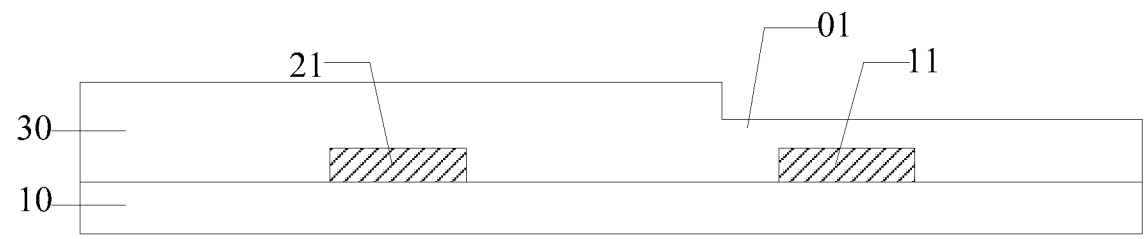

Step 3: as shown in FIG. 6C, a pattern of a guide structure 01 is formed in the gate insulating layer 30.

In specific implementation, the number of the guide structure may be one or more, which is not limited here.

In specific implementation, each guide structure extends in a first direction, and a side surface, extending in the first direction, of the guide structure may include a stepped structure or be a flat surface having an included angle with a bottom surface of greater than or equal to 60 degrees, or a surface, extending in the first direction, of the guide structure may include a concave-convex structure, which is not limited here.

Figure 6D:
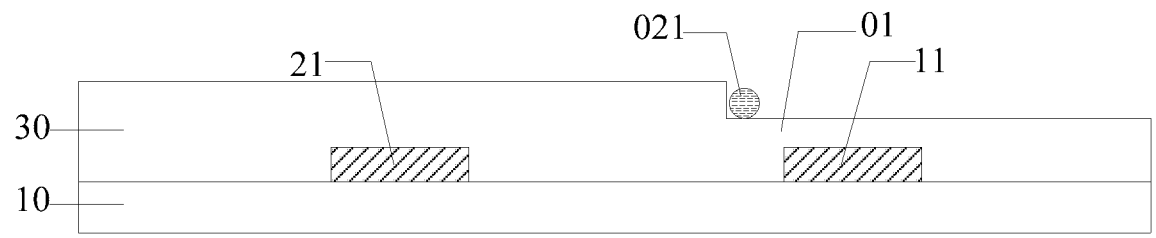

Step 4: as shown in FIG. 6D, a pattern of a catalyst particle 021 is formed on at least one side of the guide structure 01.

In specific implementation, an imprint resist may be formed on a catalyst film layer, and a nanoimprint process is performed on the imprint resist to form a pattern of an imprint resist particle; and the catalyst film layer is etched by using the pattern of the imprint resist particle as a mask pattern to form the pattern of the catalyst particle. Alternatively, a nanoimprint process is performed on the imprint resist to form a pattern of an imprint resist line; the catalyst film layer is etched by using the pattern of the imprint resist line as a mask pattern to form a pattern of a catalyst line; a plasma bombardment is performed on the catalyst line to form the pattern of the catalyst particle. Of course, the pattern of the catalyst particle may also be formed by a lithography process.

Further, the particle diameter of the catalyst particle may be controlled to 5 nm~10 μl, such as 5 nm, 10 nm, 50 nm, 100 nm, 500 nm, 1μ0, or 10μ0, which is not limited here. The material of the catalyst particle includes indium, tin, nickel, or indium oxide, which is not limited here.

Figure 6E:
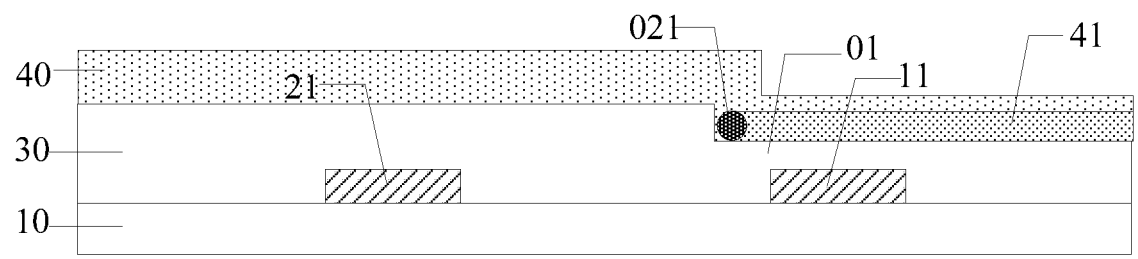

Step 5: as shown in FIG. 6E, an amorphous silicon film 40 covering the catalyst particle 021 and the guide structure 01 is formed; and the amorphous silicon film 40 is annealed, so that amorphous silicon starts to grow from the catalyst particle 021 in the extending direction of the guide structure 01 to form a silicon-based nanowire 41.

In specific implementation, a plasma enhanced chemical vapor deposition (PECVD) method is used to deposit the amorphous silicon film of 5 nm~5000 nm, and further the thickness of the amorphous silicon film may be controlled to 10 nm~1000 nm, which is not limited here.

In specific implementation, the eutectic point of the catalyst particle and silicon may be within a temperature range of 200° C.~1000° C., and an annealing temperature may be controlled to 200° C.~600° C., which is not limited here. Further, the annealing temperature may be controlled to 250° C.~450° C.

Figure 6F:
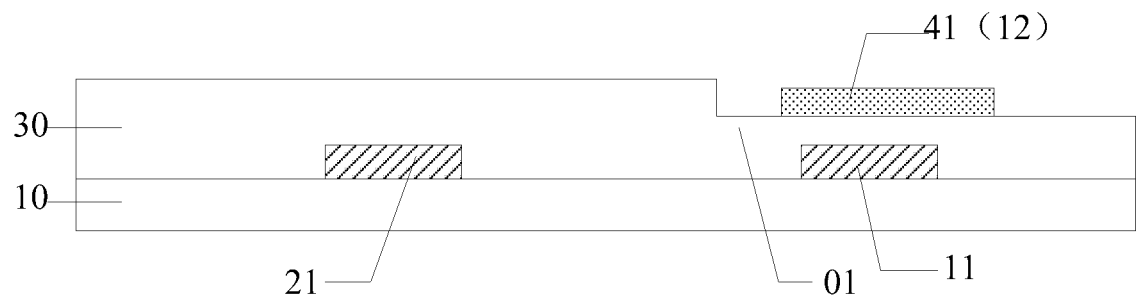

Step 6: as shown in FIG. 6F, the catalyst particle 021 is removed, and the amorphous silicon film (not shown in the figure) and the silicon-based nanowire 41 in a first preset area are retained to form a pattern of a first active layer 12.

Figure 6G:
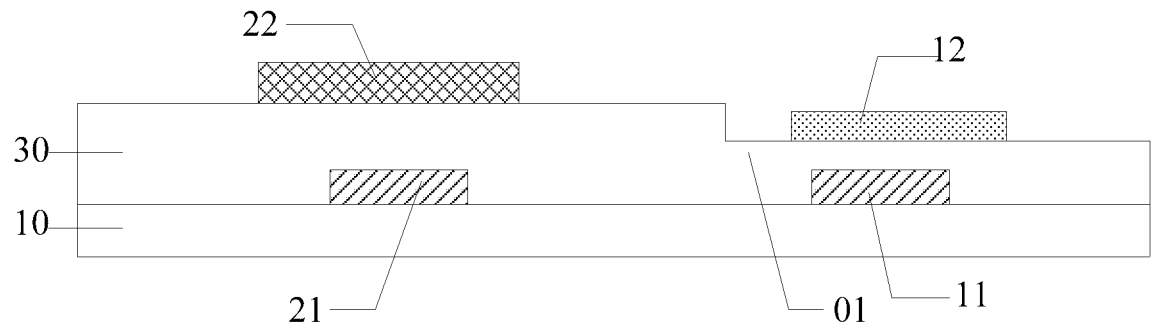

Step 7: as shown in FIG. 6G, a pattern of a second active layer 22 is formed.

Specifically, the material of the second active layer is a carbon nanotube material, and may be formed by spin coating and patterned etching processes, and the thickness of the material of the second active layer is controlled to 1 nm~1000 nm.

Specifically, the material of the second active layer is an oxide semiconductor material, and may be formed by deposition and patterned etching processes.

Figure 6H:
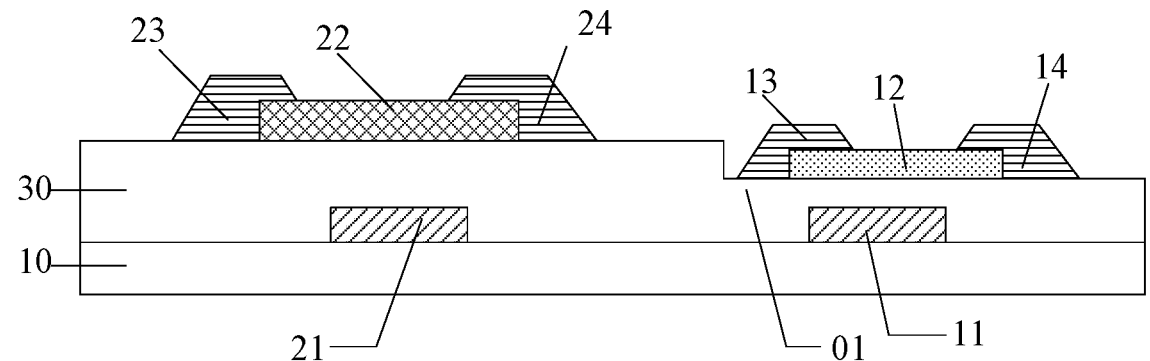

Step 8: as shown in FIG. 6H, patterns of a first source electrode 13, a first drain electrode 14, a second source electrode 23, and a second drain electrode 24 are formed by one patterning process.

In specific implementation, the materials of the source electrodes and the drain electrodes may be a metal or alloy such as molybdenum (Mo), aluminum (Al), copper (Cu), or nickel (Ti), which is not limited here.

Figure 7:
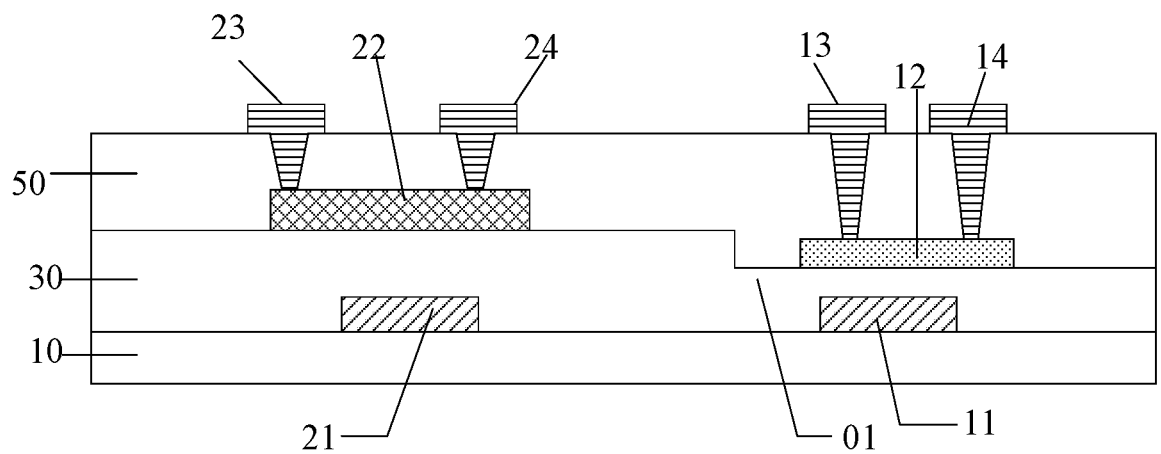
FIG. 7 is a structural diagram of an array substrate provided by an embodiment of the present disclosure.

In the above embodiment, as shown in FIG. 7, before the patterns of the first source electrode 13, the first drain electrode 14, the second source electrode 23, and the second drain electrode 24 are formed, the method may also include forming a pattern of an etch barrier layer 50. The first source electrode 13 and the first drain electrode 14 are connected with the first active layer 12 through via holes running through the etch barrier layer 50, and the second source electrode 23 and the second drain electrode 24 are connected with the second active layer 22 through via holes running through the etch barrier layer 50.

In specific implementation, the material of the etch barrier layer is a dielectric material, such as silicon nitride (SiNx), silicon oxide (SiOx), or aluminum oxide (AllOx), and its thickness may be controlled to 50 nm~5000 nm, which is not limited here.

It should be noted that in the above-mentioned preparation method provided by the embodiments of the present disclosure, the order of forming the first active layer and the second active layer may be reversed. That is, step 7 may be prior to steps S and step 6.

Further, in the above-mentioned preparation method provided by some embodiments of the present disclosure, in the case where the material of the second active layer is a low-temperature polysilicon material, after step 5 and before step 8, the method includes:

Step 6': an excimer laser annealing treatment is performed on the amorphous silicon film formed with the silicon-based nanowire, so that the amorphous silicon film is converted into a low-temperature polysilicon film; and Step 7': the catalyst particle is removed, the low-temperature polysilicon film is patterned, the silicon-based nanowire and the low-temperature polysilicon film in a first preset area is retained to form a pattern of a first active layer, and the low-temperature polysilicon film in a second preset area is retained to form a pattern of a second active layer.

It should be noted that in the case where the width of the silicon-based nanowire is close to that of the polysilicon film, the patterns of the first active layer and the second active layer may be formed by one patterning process, and in the case where the width of the silicon-based nanowire differs greatly from that of the polysilicon film, the patterns may be formed by one patterning process using a gray-tone mask or a half-tone mask, and of course, may also be formed by two patterning processes, which is not limited here.

Figure 8:
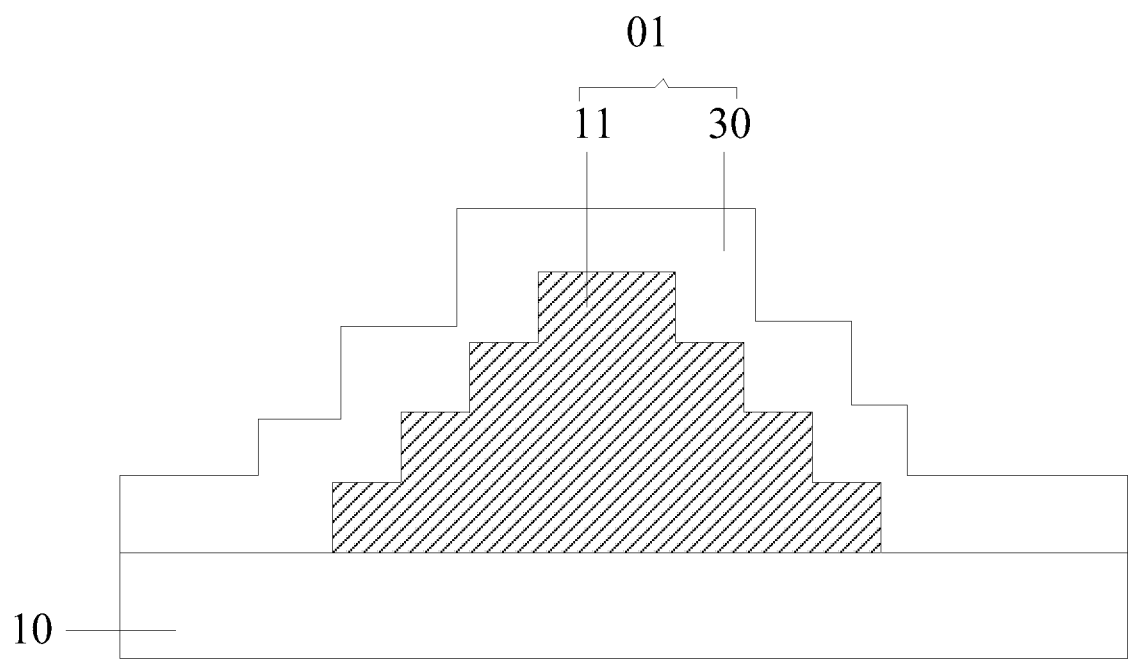
FIG. 8 is a structural diagram of a guide structure provided by an embodiment of the present disclosure.

Further, in the above-mentioned preparation method provided by some embodiments of the present disclosure, as shown in FIG. 8, the guide structure 01 may also be composed of the first gate electrode 11 and the gate insulating layer 30. That is, in step 1, the pattern of the first gate electrode 11 is prepared to be similar to the pattern of the guide structure 01, and in step 2, the gate insulating layer 30 is formed on the first gate electrode 11 such that the gate insulating layer 30 has a pattern corresponding to the first gate electrode 11. In this way, the process of patterning the gate insulating layer 30 in step 3 may be omitted.

Using the first thin film transistor and the second thin film transistor being both top-gate structures as an example, some embodiments provided by the present disclosure specifically include the following steps.

Step 01: a pattern of a guide structure 01 is formed.

Figure 9A:
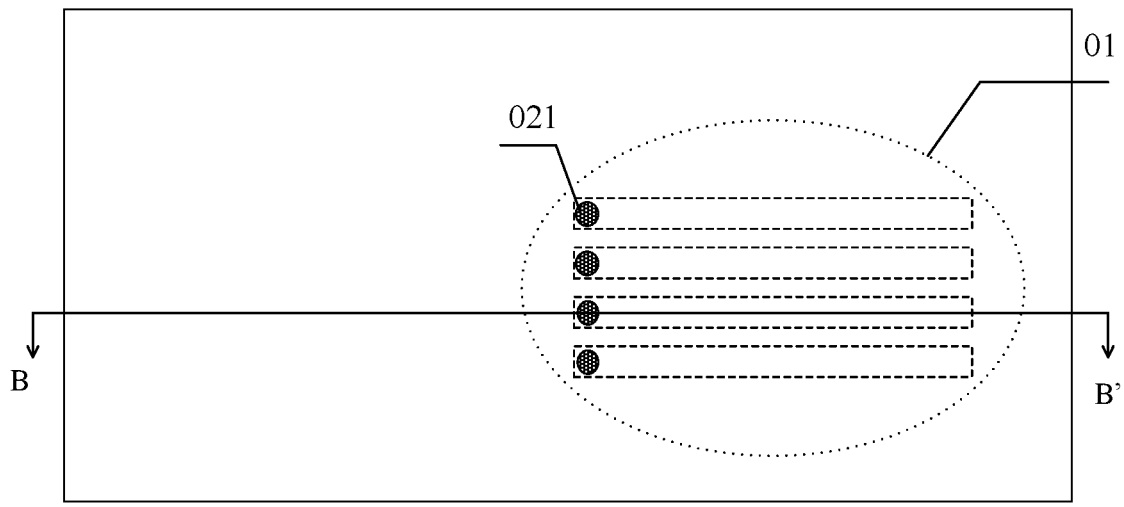
FIGS. 9A to 9I are structural diagrams in preparation of an array substrate provided by an embodiment of the present disclosure after respective steps are executed.
Figure 9B:
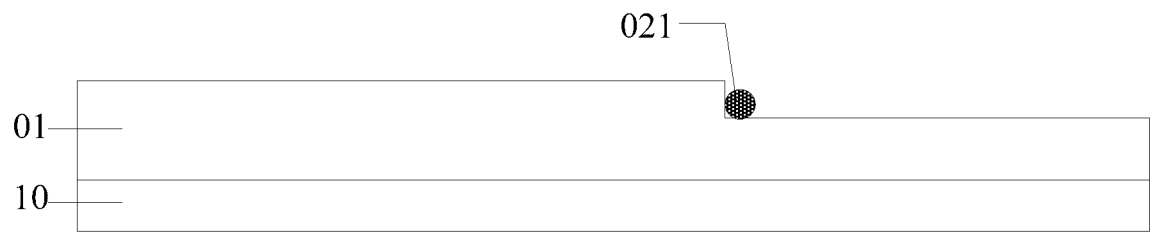

It should be noted that in FIG. 9A, a dashed rectangular box indicates a concave portion of the guide structure 01, and FIG. 9B is a cross-sectional diagram of FIG. 9A along a direction BB'.

In specific implementation, the guide structure is made of a dielectric material, such as SiOx, SiNx, or $Al_2O_3$, and its thickness is controlled to 20 nm~5000 nm, which is not limited here.

Step 02: as shown in FIGS. 9A and 9B, a pattern of a catalyst particle 021 is formed on at least one side of the guide structure 01. Specifically, a pattern of a catalyst particle 021 is formed at a concave portion or step portion of the guide structure 01.

Figure 9C:
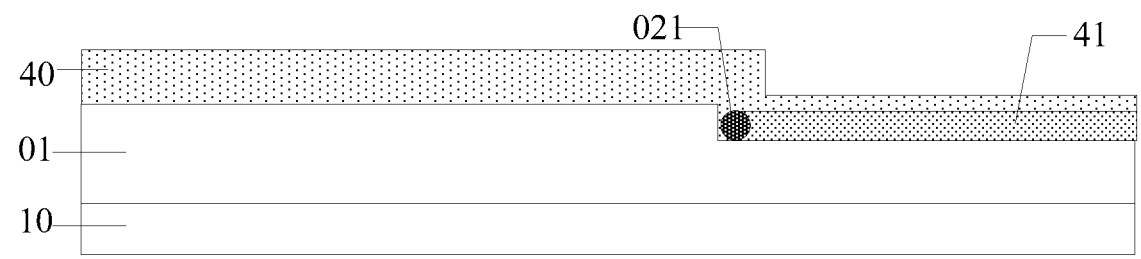

Step 03: as shown in FIG. 9C, an amorphous silicon film 40 covering the catalyst particle 021 and the guide structure 01 is formed; and the amorphous silicon film 40 is annealed, so that amorphous silicon starts to grow from the catalyst particle 021 in the extending direction of the guide structure 01 to form a silicon-based nanowire 41.

Figure 9D:
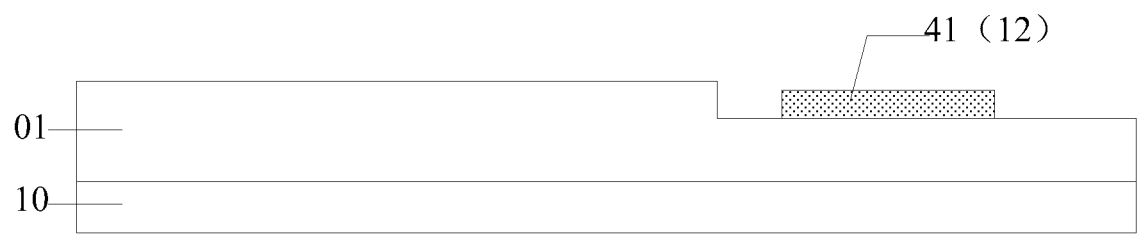

Step 04: as shown in FIG. 9D, the catalyst particle 021 is removed, and the amorphous silicon film (not shown in the figure) and the silicon-based nanowire 41 in a first preset area are retained to form a pattern of a first active layer 12.

Figure 9E:
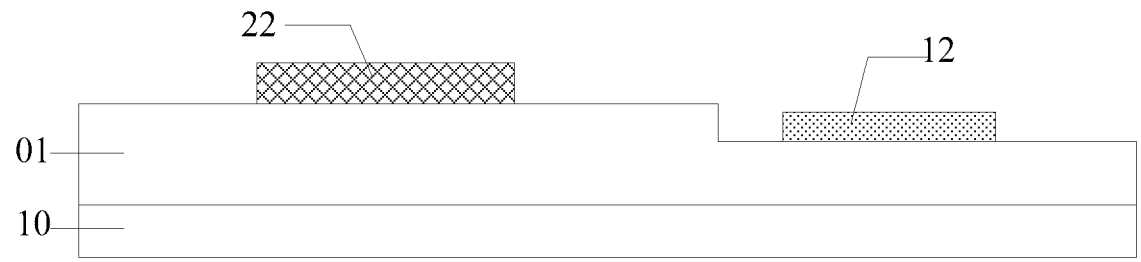

Step 05: as shown in FIG. 9E, a pattern of a second active layer 22 is formed.

Figure 9F:
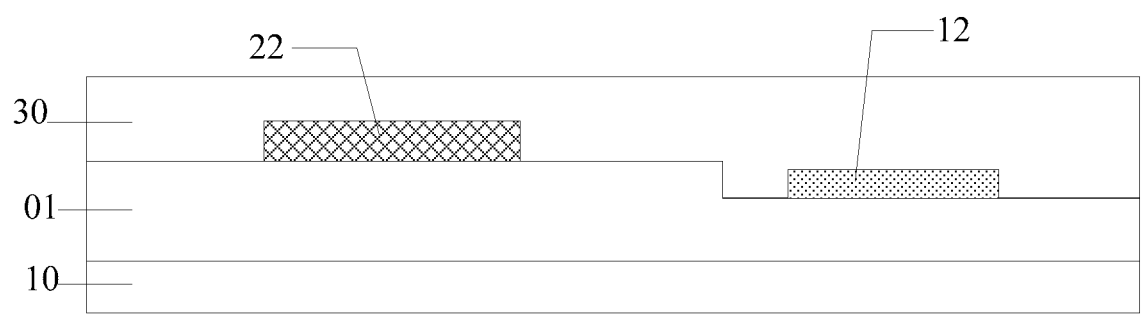

Step 06: as shown in FIG. 9F a gate insulating layer 30 is formed.

Figure 9G:
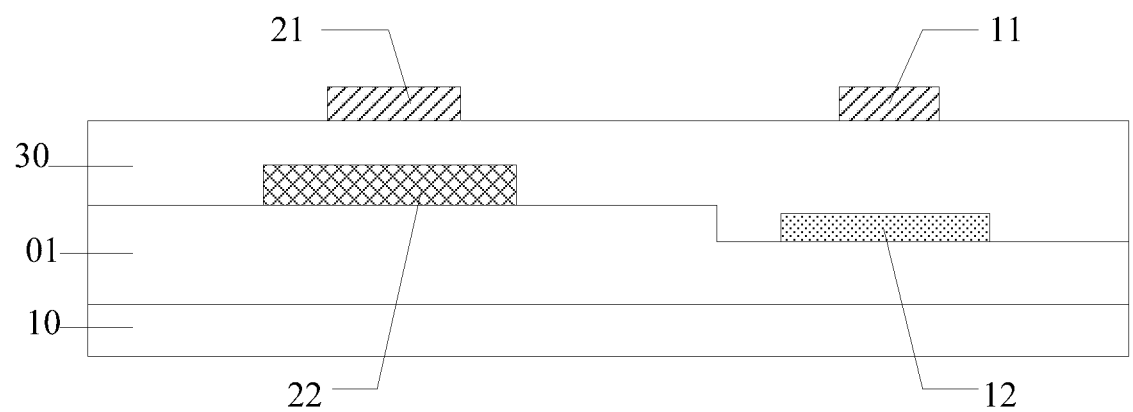

Step 07: as shown in FIG. 9G, patterns of a first gate electrode 11 and a second gate electrode 12 are formed.

Figure 9H:
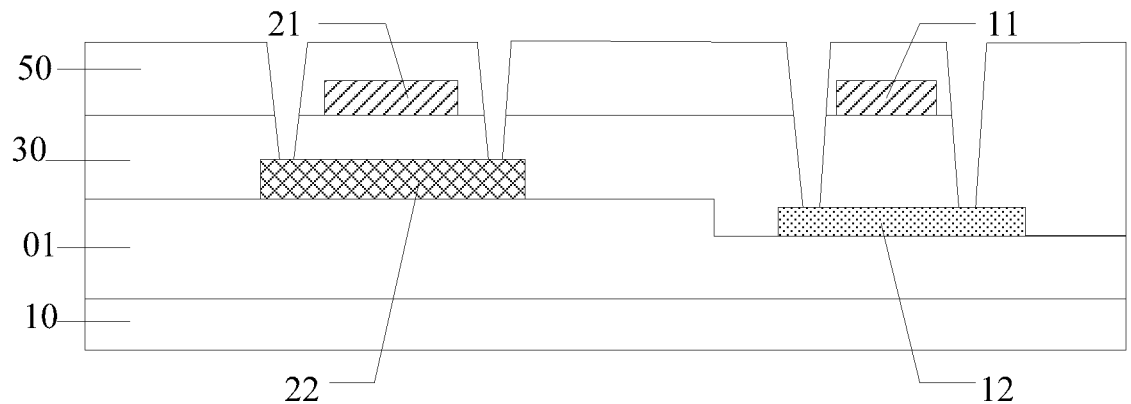

Step 08: as shown in FIG. 9H, a pattern of an etch barrier layer 50 is formed.

Figure 9I:
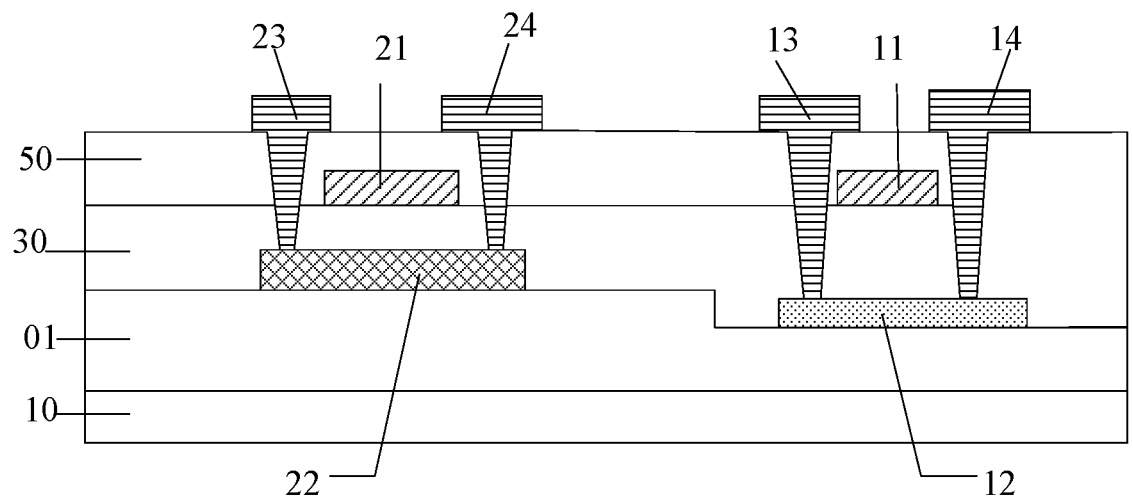

Step 08: as shown in FIG. 9I, patterns of a first source electrode 13, a first drain electrode 14, a second source electrode 23, and a second drain electrode 24 are formed by one patterning process. The first source electrode 13 and the first drain electrode 14 are connected with the first active layer 12 through via holes running through the etch barrier layer 50 and the gate insulating layer 30, and the second source electrode 23 and the second drain electrode 24 are connected with the second active layer 22 through via holes running through the etch barrier layer 50 and the gate insulating layer 30.

In the above-mentioned embodiment, a buffer layer may also be formed before the guide structure is formed, to isolate impurities in the base substrate.

Of course, in specific implementation, the buffer layer may also be patterned to form the guide structure. For example, the buffer layer is formed of silicon nitride (SiNX) or silicon oxide (SiOx), and its thickness is controlled to 10 nm~1000 nm, and then the guide structure is formed by a patterning process. In this way, not only can the buffer layer isolate impurities in the base substrate, but also a separate film layer for fabricating the guide structure can be omitted.

In specific implementation, in the manufacturing process, the top-gate thin film transistor and the bottom-gate thin film transistor only differ in the order of fabrication of the film layers. Therefore, for the preparation of the film layers in the above-mentioned top-gate thin film transistor, reference may be made to the preparation of the film layers with the same functions in the above-mentioned bottom-gate thin film transistor.

Figure 10:
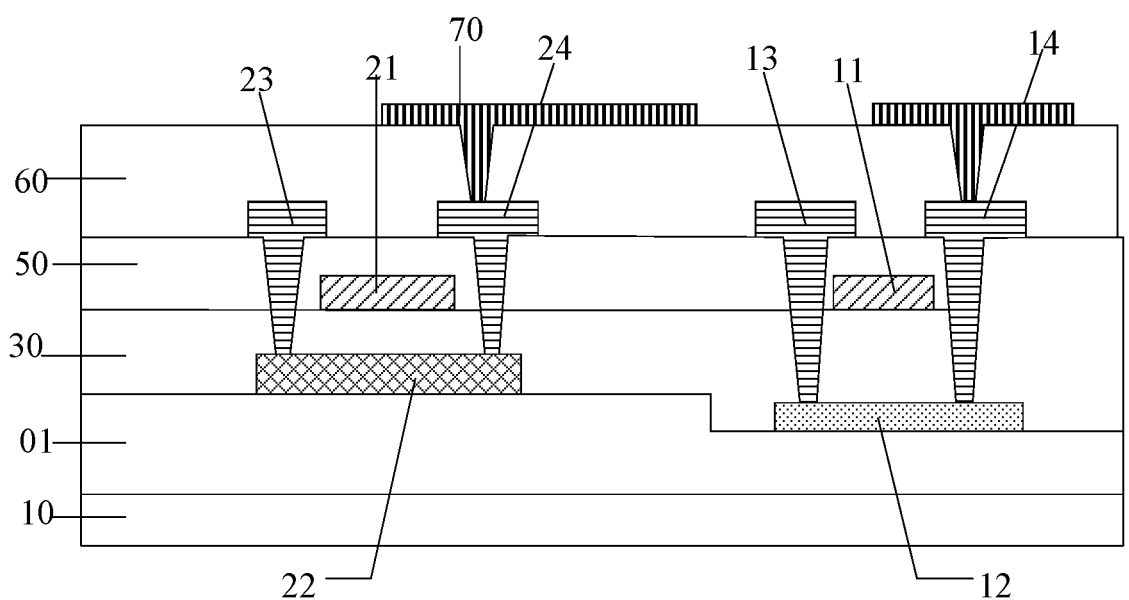
FIG. 10 is a structural diagram of an array substrate provided by an embodiment of the present disclosure.

In specific implementation, in the case where the above-mentioned array substrate is applied to a display panel, after the formation of the first thin film transistor and the second thin film transistor, as shown in FIG. 10, the method further includes forming a planarization layer 60, an electrode layer 70 and the like on the base substrate 10, which is not limited here.

In specific implementation, the present disclosure is not limited to the above-mentioned structures, and is also suitable for a TFT structure in which the first thin film transistor is a bottom-gate transistor and the second thin film transistor is a top-gate transistor, or the first thin film transistor is a top-gate transistor and the second thin film transistor is a bottom-gate transistor, which can be understood by those skilled in the art without knowledge creation, and will not be detailed here.

Based on the same inventive concept, embodiments of the present disclosure further provide an array substrate, which is prepared by using any of the above-mentioned preparation methods provided by embodiments of the present disclosure; as shown in FIGS. 6H, 7 and 9I, the array substrate includes a first thin film transistor and a second thin film transistor on a base substrate 10; the first thin film transistor includes a first gate electrode 11, a first active layer 12, a first source electrode 13 and a first drain electrode 14; and the second thin film transistor includes a second gate electrode 21, a second active layer 22, a second source electrode 23 and a second drain electrode 24.

In the first thin film transistor, at least one guide structure 01 extending in a first direction is disposed under the first active layer 12, and the material of the first active layer 12 includes a silicon-based nanowire, and an extending direction of the silicon-based nanowire is same as the extending direction of the guide structure 01.

The material of the second active layer 22 is different from that of the first active layer 12.

Optionally, in the array substrate provided by the embodiments of the present disclosure, the material of the second active layer may be a low-temperature polysilicon material, a carbon nanotube material or an oxide semiconductor material.

Figure 11A:
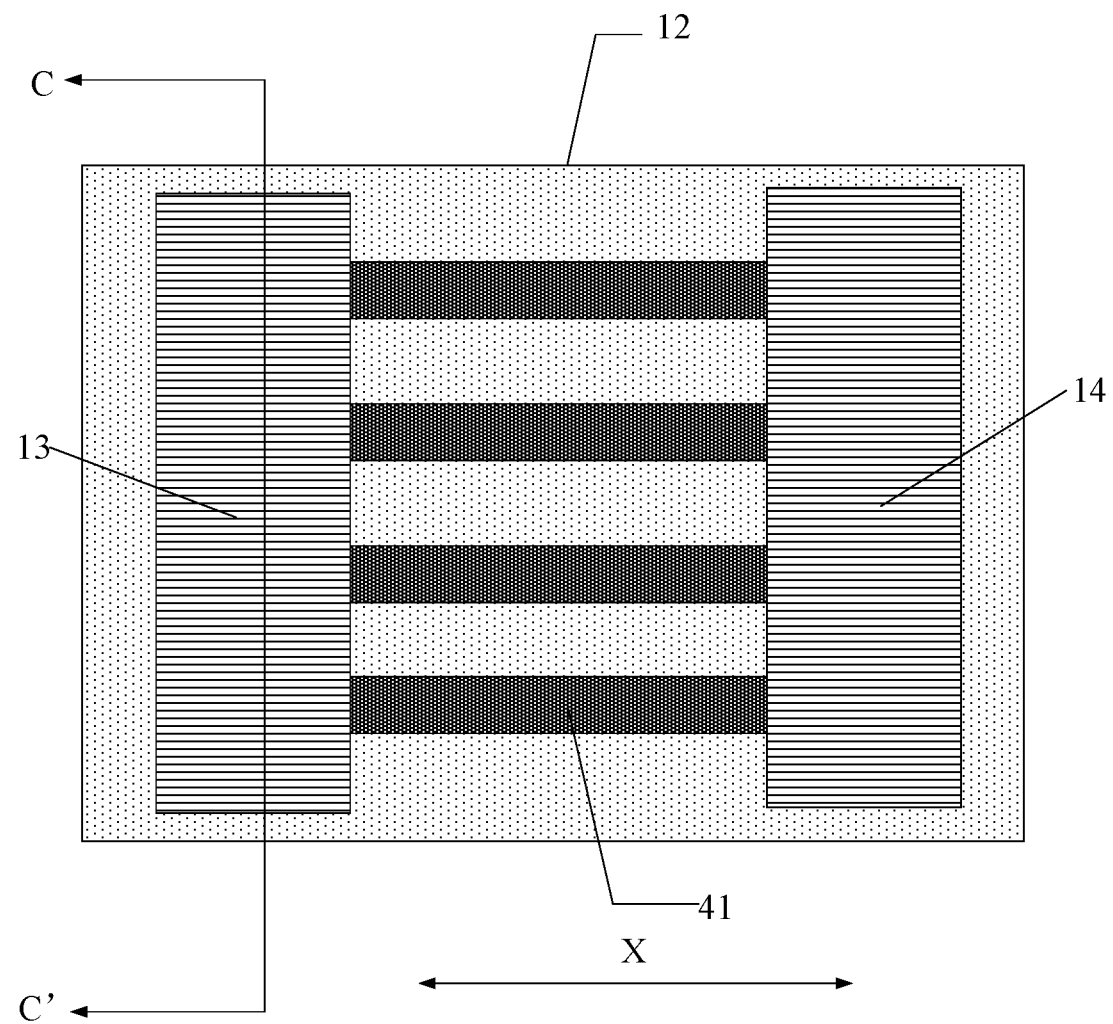
FIG. 11A is a structural diagram of a first thin film transistor in an array substrate provided by an embodiment of the present disclosure.
Figure 11B:
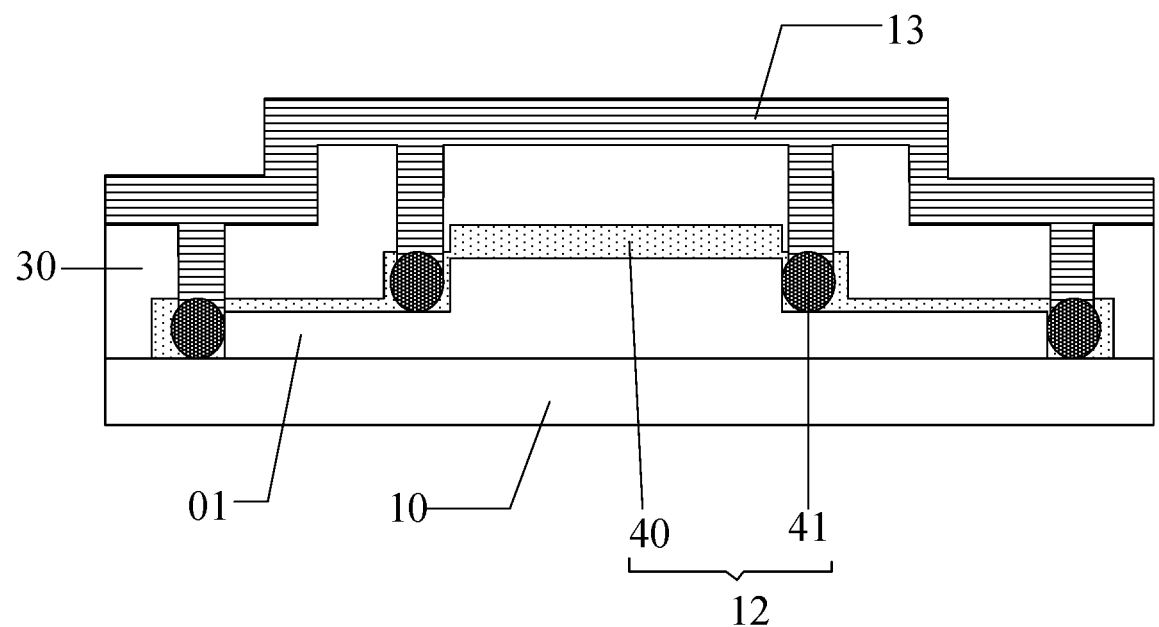
FIG. 11B is a cross-sectional diagram of the first thin film transistor shown in FIG. 11A along a direction CC'.

In specific implementation, referring to FIGS. 11A and 11B, in the first thin film transistor, the length of the guide structure 01 along the first direction X is greater than the length of the silicon-based nanowire along the first direction X, and the guide structure 01 extends along the first direction X; and an extending direction of the silicon-based nanowire 41 is same as the extending direction of the guide structure 01, and is a connecting line direction of the first source electrode 13 and the first drain electrode 14. FIGS. 11A and 11B are only for illustrating the positional relationship of the silicon-based nanowire 41 in the first thin film transistor.

In specific implementation, as the problem-solving principle of the array substrate is similar to that of the above-mentioned method for preparing an array substrate, for the implementation of the array substrate, reference may be made to the implementation of the above-mentioned preparation method, and repeated description is omitted.

Based on the same inventive concept, embodiments of the present disclosure further provide a display panel, which includes the above-mentioned array substrate provided by embodiments of the present disclosure. The display panel may be a mobile phone, a tablet computer, a television, a display, a notebook computer, a digital photo frame, a navigator, or any other product or component with a display function. For the implementation of the display device, reference may be made to the embodiments of the above-mentioned array substrate, and repeated description is omitted here.

In specific implementation, the first thin film transistor may be located in a border area of the display panel, so that the width of the border may be reduced.

Embodiments of the present disclosure provide an array substrate, a method for preparing the array substrate, and a display panel. The method includes: forming a first thin film transistor and a second thin film transistor on a base substrate. In the formation of an active layer of the first thin film transistor, by using an eutectic point of the catalyst particle and silicon, and a driving factor that the Gibbs free energy of amorphous silicon is greater than that of crystalline silicon (silicon-based nanowire), and due to absorption of the amorphous silicon by the molten catalyst particle to form a supersaturated silicon eutectoid, the silicon nucleates and grows into a silicon-based nanowire. Moreover, during the growth of the silicon-based nanowire, the amorphous silicon film grows linearly along guide structure under the action of the catalyst particle, thus obtaining a silicon-based nanowire with a high density and high uniformity. In addition, by controlling the size of the catalyst particle and the thickness of the amorphous silicon film, the width of the silicon-based nanowire may also be controlled. In this way, a thin film transistor having a silicon-based nanowire with a uniform and controllable size is prepared. In addition, the first active layer and the second active layer are made by different materials, such that different thin film transistors have different advantages to increase the application range of the array substrate.

Evidently, those skilled in the art can make various modifications and variations to the present disclosure without departing from the spirit and scope of the present disclosure. Thus, the present disclosure is also intended to encompass these modifications and variations thereto so long as the modifications and variations come into the scope of the claims appended to the present disclosure and their equivalents.

What is claimed is:

1. An array substrate, comprising:
   a base substrate;
   a first thin film transistor on the base substrate;
   wherein the first thin film transistor comprises: a first gate electrode, a first active layer, a first source electrode, and a first drain electrode;
   wherein the first active layer comprises:
   at least one guide structure extending in a first direction;
   a silicon-based nanowire, disposed on a side of the guide structure facing away from the base substrate; and
   an extending direction of the silicon-based nanowire is same as an extending direction of the guide structure;
   wherein the first active layer comprises a plurality of guide structures;
   each of the plurality of guide structures extends in a first direction;
   a cross section of the plurality of guide structures perpendicular to the first direction comprises a concave-convex structure;
   wherein the concave-convex structure comprises a concave portion and a convex portion; and the silicon-based nanowire is located at a position corresponding to the concave portion.

2. The array substrate according to claim 1, wherein surfaces of all convex portions of the concave-convex structure are approximately flush.

3. The array substrate according to claim 1, wherein a height difference between the convex portion and the concave portion is greater than or equal to 10 μm.

4. The array substrate according to claim 1, further comprising: a first gate insulating layer, disposed on a side of the first gate electrode facing away from the base substrate;
   wherein the first gate insulating layer is reused as the guide structure.

5. The array substrate according to claim 1, wherein the first gate electrode is disposed on a side of the first active layer facing away from the base substrate;
   the array substrate further comprises: a dielectric layer, disposed on a side of the first gate electrode facing the base substrate; and
   the dielectric layer is reused as the guide structure.

6. The array substrate according to claim 5, wherein a material of the dielectric layer comprises at least one of: aluminum oxide; silicon oxide; or silicon nitride.

7. The array substrate according to claim 1, wherein a length of the guide structure along the first direction is greater than a length of the silicon-based nanowire along the first direction.

8. The array substrate according to claim 1, wherein a connecting line direction of the first source electrode and the first drain electrode is same as the extending direction of the silicon-based nanowire.

9. The array substrate according to claim 3, further comprising: a second thin film transistor on the base substrate;
   wherein the second thin film transistor comprises: a second gate electrode, a second active layer, a second source electrode, and a second drain electrode; and
   a material of the second active layer is different from a material of the first active layer.

10. The array substrate according to claim 9, wherein the material of the second active layer comprises at least one of: a low-temperature polysilicon material, a carbon nanotube material, or an oxide semiconductor material.

11. The array substrate according to claim 9, wherein the second thin film transistor further comprises a second gate insulating layer; the first gate insulating layer is arranged on a same layer as the second gate insulating layer; and the first source electrode, the first drain electrode, the second source electrode, and the second drain electrode are arranged on a same layer.

12. A display panel, comprising the array substrate according to claim 1.

* * * * *